United States Patent [19]

Bruning

[11] 3,842,259

[45] Oct. 15, 1974

[54] HIGH VOLTAGE AMPLIFIER

[75] Inventor: John Henry Bruning, Brookside, N.J.

[73] Assignee: Bell Telephone Laboratories Incorporated, Murray Hill, N.J.

[22] Filed: Sept. 24, 1973

[21] Appl. No.: 400,066

[52] U.S. Cl. .............. 250/213 A, 250/551, 307/311

[51] Int. Cl. ........................................... H01j 39/12

[58] Field of Search ........ 250/213 A, 551; 307/311, 307/262, 243

[56] References Cited

UNITED STATES PATENTS

| | | | |
|---|---|---|---|
| 3,321,631 | 5/1967 | Biard | 250/213 A |
| 3,355,600 | 11/1967 | Mapham | 250/551 |
| 3,476,941 | 11/1969 | Bonin | 307/311 |
| 3,524,986 | 8/1970 | Harnden | 307/311 |
| 3,535,532 | 10/1970 | Merryman | 307/311 |
| 3,655,988 | 4/1972 | Nakamura | 250/213 A |

*Primary Examiner*—Archie R. Borchelt
*Assistant Examiner*—D. C. Nelms
*Attorney, Agent, or Firm*—I. Ostroff

[57] ABSTRACT

A high voltage amplifier contains serially coupled complementary output transistors, input circuitry comprising two logic gates and a delay element, and optically coupled isolators between the input and output circuitry. The input circuitry insures that only one of the output transistors can be on at a time. This minimizes power dissipation and the possibility of excess current drain that can destroy the output transistors. The optically coupled isolators insure that a failure in the output transistors cannot propagate to and destroy the input circuitry.

12 Claims, 7 Drawing Figures

HIGH VOLTAGE AMPLIFIER

BACKGROUND OF THE INVENTION

This invention relates to relatively high output voltage solid state amplifiers. It will be convenient to discuss the invention with particular reference to an amplifier designed specifically for driving a piezoelectric transducer. Piezoelectric transducers may be used to directly convert electrical signals into physical displacements. They are finding increasing use in many applications, such as for laser cavity modulation and stabilization and as micropositioners. Many of these transducers require high voltage drivers.

For example, in the May, 1971 issue of *IEEE Transactions on Instrumentation*, an article entitled "High-Voltage Video Amplifier for Driving Piezoelectric Transducers" describes a solid state amplifier comprising over 50 active and passive components and having a maximum output voltage amplitude of 280 volts. Power supply current limiting is utilized in order to avoid overdissipation. Protection is important since a failure in the output circuitry due to overdissipation could easily propagate back to the input and damage both the input circuitry and any driver coupled to the input.

For uses of this kind it is desirable to have an amplifier which is completely solid state, relatively noncomplex, has good electrical isolation between input and output stages, and provides relatively high output voltage pulses.

OBJECTS OF INVENTION

Accordingly, an object of this invention is a relatively noncomplex solid state amplifier which operates at relatively high output voltage levels and is characterized by relatively high electrical isolation between the input and output stages.

SUMMARY OF THE INVENTION

This and other objects of the invention are attained in an amplifier circuit comprising as an input stage a dual input NAND gate, and a dual input NOR gate, as an output stage, a pair of complementary output transistors, and for isolation therebetween a pair of light-emitting diodes and corresponding phototransistors. In one embodiment, the first inputs of each of the gates are coupled together to a terminal which serves as the input to the amplifier. A resistor is coupled between this input terminal and the second inputs to each of both gates. A capacitor is also coupled to each of the second inputs of the gates. The outputs of the two gates are supplied to light-emitting diodes (LEDs), each of which optically is coupled to a separate phototransistor. The phototransistors are, respectively, coupled to complementary output transistors. A terminal connected to the collectors of the output transistors serves as the amplifier output terminal.

When an input voltage pulse is applied to the amplifier, waveforms are created by the logic gates resistor and capacitor that bias the LEDs such that during a selected period of time there is simultaneous light emission from both LEDs. Before and after this simultaneous emission only one of the two LEDs emits light. Because of the way the phototransistors are coupled to the output transistors, conduction can occur in only one of the output transistors at a time. This condition helps keep power dissipation relatively low and helps insure against overdissipation which could destroy the output transistors.

The isolation offered by the LED-phototransistor combination insures good electrical isolation between the relatively low power input logic circuitry and the output transistors. This isolation also protects any driver circuit coupled to the input of the amplifier. A failure in the ouptut transistors is not able to propagate back into the logic circuitry or to any such driver circuit. In addition, the isolation allows the supply potentials associated with the input circuitry to be independent of those associated with the output transistors.

Another embodiment of the amplifier utilizes a dual input NAND gate and a dual input OR gate as the input stage, a pair of npn-phototransistors as the output stage, and a pair of light-emitting diodes for isolation between the input and output stages.

This amplifier finds particular application as a driver for a piezoelectric element which forms the basic element of a micropositioner.

These and other objects, features and advantages of the invention will be better understood from a consideration of the following detailed description taken in conjunction with the accompanying drawing.

DETAILED DESCRIPTION

Figure 1:
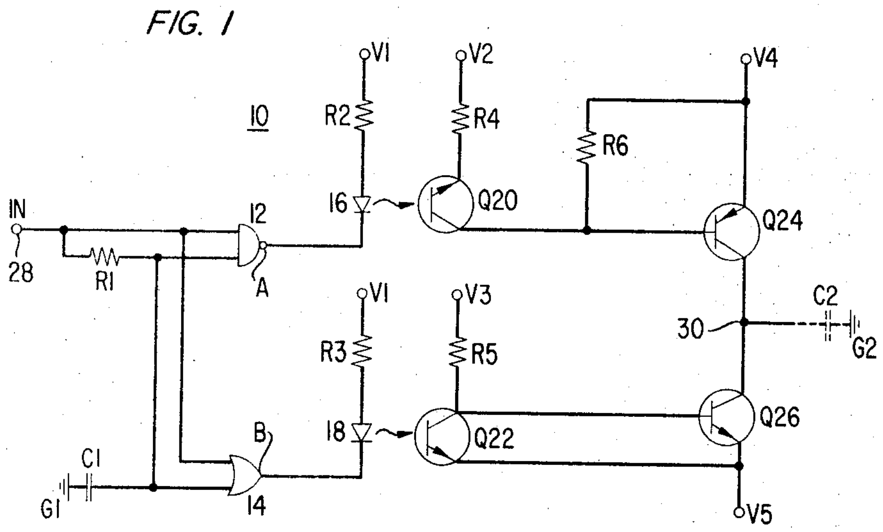
FIG. 1 illustrates in schematic form an amplifier circuit in accordance with the invention.

Now referring to FIG. 1, there is illustrated an amplifier circuit 10 in accordance with this invention. The amplifier 10 comprises a two-input NAND gate 12, a two-input NOR gate 14, a first light-emitting diode (LED) 16, a second light-emitting diode (LED) 18, a first npn-type phototransistor Q20, a second npn-type phototransistor Q22, a pnp-type output transistor Q24, and an npn-type output transistor Q26. Terminal 28, which is directly coupled to the first input both of the NAND gate 12 and of the NOR gate 14, serves as the input terminal. Resistor R1 is coupled between input terminal 28 and the second input of each of logic gates 12 and 14. Capacitor C1 is coupled between a ground G1 and the second input of each of the logic gates 12 and 14. Ground G1 is generally electrically isolated from any supply or ground G2 associated with phototransistors Q20 and 22 and output transistors Q24 and 26.

The cathodes of LED 16 and 18 are coupled to the outputs of gates 12 and 14, respectively. The anodes of LEDs 16 and 18 are coupled through resistors R2 and R3, respectively, to a supply potential V1. The emitter of Q20 is coupled through resistor R4 to supply potential V2 and the collector of Q20 is coupled to the base of Q24. The collector of Q22 is coupled to the base of Q26 and through resistor R5 to supply potential V3. The base of Q24 is coupled through resistor R6 to the emitter of Q24, which is coupled to supply potential V4. The emitters of Q22 and Q26 are coupled together to supply potential V5.

Terminal 30, which is coupled to the collectors of Q24 and Q26, serves as the amplifier output terminal. LED 16 and Q20 are physically located such that light emitted by LED 16 is received on the photosensitive base of Q20 and gives rise to conduction therein. Likewise, light emitted by LED 18 is received on the photosensitive base of Q22 and gives rise to conduction therein.

Figure 2A:
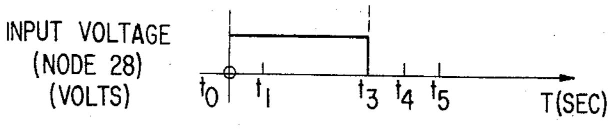
FIGS. 2A, 2B, 2C and 2D illustrate graphically the timing relationship between the input waveform, the outputs of the two logic gates, and the output waveform of the circuit shown in FIG. 1.
Figure 2B:
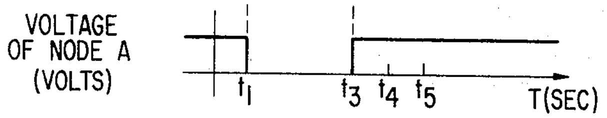
Figure 2C:
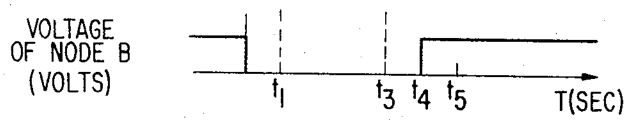
Figure 2D:
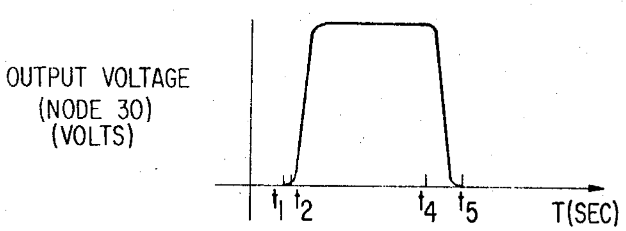

The operation of the amplifier 10 of FIG. 1 is easily understood from the voltage vs. time graphs of FIGS. 2A through 2D. FIG. 2A illustrates a typical input waveform applied to input terminal 28. FIGS. 2B and 2C illustrate the resulting waveforms at the output of NAND gate 12 (node A) and the output of NOR gate 14 (node B). FIG. 2D illustrates the output waveform appearing at terminal 30.

The waveforms of FIGS. 2A–2C are illustrated in idealized form in that the rising and falling edges of the voltage pulses are shown as essentially vertical lines. A time denoted, for example, as $T = t_3-$ is that time just prior to the time $T = t_3$. Correspondingly, a time denoted as $T = t_3+$ is that time which occurs just after time $T = t_3$. For example, in FIG. 2A at $T = t_3-$ the input voltage (node 28) is at a more positive value than at $T = t_3+$.

Referring now to FIGS. 2A through 2D, an input voltage pulse is applied to terminal 28 between $T = t_0$ and $t_3$. At $T = t_0-$ nodes A and B are both in the high state and substantially no current flows through from V1 through R2 and LED 16 or R3 and LED 18. There is therefore no light emitted by either LED. Correspondingly, Q20 and Q22, which are optionally coupled to LED 16 and LED 18, respectively, receive no light energy and are therefore nonconducting. The coupling between Q20 and Q24 is such that Q24 cannot conduct unless Q20 conducts. At this point in time, Q26 is biased such that conduction can occur through it which discharges a load capacitance C1 (illustrated in dashed lines) coupled to terminal 30. When Q22 conducts, Q26 is biased such that there is substantially no conduction through it. If it is assumed that the conditions existing at $T = t_0-$ have existed for some time, then any charge on C1 has been dissipated through Q26. This leaves the potential of node 30 at approximately the value of supply potential V5.

At $T = t_0-$ the potentials of nodes A and B are at the high output states of the NAND and NOR gates 12 and 14. At $T = t_0+$ the input voltage at terminal 28 assumes a high state. The potential of node A remains at the high state until C1 charges through R1 to the high state. At this point in time ($T = t_1+$) the two inputs to NAND gate 12 are both in the high state and therefore the output of NAND gate 12 switches to the low state. Node B is switched to the low state at $T = t_0+$ (assuming that NOR gate 14 is an idealized gate which has no propagation delay time) because one of the two inputs to NOR gate 14 goes to the high state at $T = t_0+$.

Between $T = t_0+$ and $t_1+$, node B is at the low state and current flows from V1 through R3 and LED 18. This causes light emission from LED 18 that is received on the photosensitive base of Q22 and gives rise to conduction therein. This conduction in Q22 cuts off any possible conduction in Q26. During this period of time the potential of node A is still at the high state and therefore both Q20 and Q24 are nonconducting.

Between $T = t_1+$ and $t_3-$ the potential of nodes A and B are both low and light emission occurs from both LED 16 and LED 18. This condition maintains conduction in Q22 thereby insuring that Q26 is off. It further allows conduction within Q20 which allows Q24 to conduct and to thereby charge C1 to a potential close to that supply potential V4.

At $T = t_3+$ the potential of node A returns to the high state in response to the drop in the input potential at terminal 28 to the low state. Light emission from LED 16 ceases and thereby cuts off conduction in Q20 and Q24. Between $T = t_3+$ and $t_4-$ the potential of node B stays low thereby maintaining light emission from LED 18 which in turn maintains conduction in Q22 which keeps Q26 off. By $T = t_4+$ C1 has discharged through R1 and the second input to NOR gate 14 goes to the low state, thus the potential of node B returns to the high state. This causes light emission from LED 18 to cease and consequently causes Q22 to stop conducting and therefore allows Q26 to begin to conduct. Q26 conducts until $T = t_5$. At this point in time, the charge stored on C2 when Q24 conducted is discharged (see FIG. 2D).

FIG. 2D illustrates the resulting output waveform at terminal 30. There is a small delay time (from $T = t_1$ to $t_2$) until Q20 and Q26 turn on and the potential of terminal 30 begins to rise. Soon after Q22 turns off ($T = t_4+$) Q26 turns on and discharges C2.

The applications of the waveforms of FIGS. 2B and 2C to the cathodes of LEDs 16 and 18 cause light to be emitted by these diodes which, in turn, becomes base drive for transistors Q20 and Q22. During the period of time from $T = t_1$ to $t_3$, Q20 conducts by drawing collector current from V4 through R6 and the emitter base junction of Q24. Q24 is therefore biased on and the current flowing therethrough charges C1 to a potential close to that of supply potential V4.

During the period of time from $T = t_0$ to $t_4$ which overlaps the time interval of $T = t_1$ to $t_3$, Q22 conducts, since it is also receiving base drive. Because the emitters of Q22 and Q26 are coupled together and the base of Q26 is coupled to the collector of Q22, there can be no conduction in Q26 when Q22 conducts, since when Q22 conducts there is insufficient forward-bias across the emitter base junction of Q26 to permit conduction therein. This condition insures that during the time interval from $T = t_1$ to $t_3$ that only Q24 can conduct. The only times at which Q26 can conduct is prior to $T = t_0$ and subsequent to $T = t_4$. It is therefore not possible for Q24 and Q26 to conduct simultaneously. This means that there can be no steady state flow of current from supply V4 to supply V5. Power dissipation is thus limited and excessive dissipation in Q24 and Q26 is insured against.

The use of LED-phototransistor pairs (i.e., optical isolators) allows for relatively high electrical isolation (typically 1500 volts or higher) between Q24 and Q26 and their respective logic gates 12 and 14, and any driver circuit (not illustrated) coupled to terminal 28. In addition, the LED-phototransistor pairs allow the supply potential V1 to be independent of supply potentials V2, V3, V4 and V5. This is because the sources delivering photons (LED 16 and 18) to the base of Q20 and the base of Q22 are not physically electrically connecteed in any way to the emitters of Q20 and Q22. Base drive is, of course, obtained by photon absorption.

In one embodiment of the invention that has been built, the dual LED-phototransistor combination used is an MCT-2D made by Monsanto. The NAND gate is one of the two NAND gates of a 75452, made by Texas Instruments. The NOR gate is one of the two NOR gates of a 75454 also made by Texas Instruments. Output transistors Q24 and Q26 are TRSP6204S and TRS6204S, respectively. The sustained breakdown voltage of these transistors is 620 volts. Both transistors are made by Industro Transistor Corporation. The following values of resistors, capacitors and supply voltages are utilized in the embodiment.

C1 = 0.01μF
R1, R5 = 100Ω
R2, R3 = 270Ω
R4 = 330Ω
R6 = 200Ω
V1 = +5 volts
V2 = +496 volts
V3 = +4 volts
V4 = +500 volts
V5 = 0 volts The amplitude of the input waveform of FIG. 1 is typically 5 volts and the pulse width is typically 10 microseconds. The base level of the input waveform and ground G1 and ground G2 are all typically 0 volts. The rise and fall times of the input pulse are typically approximately 20 nanoseconds. The high state of logic gates 12 and 14 is typically +5 volts and the low state is typically 0 volts. The amplitude of the output pulse is typically 500 volts. The rise time with a thousand picofarad load capacitance is typically 5 microseconds and the fall time is typically about 4 microseconds. For a 1000 pF load, the power dissipation is approximately 2 watts with an input pulse repetition rate of 10 kHz.

Because of the high electrical isolation between the input and output voltages, the supply voltages V4 and V5 may be varied considerably with respect to ground G1. However, the potential difference between V4 and V5 must be within the breakdown voltage ($V_{ces}$) of both transistors Q24 and Q26. For example, V4 could be +500V and V5 could be 0 volts, or V4 could be 0 volts and V5 could be −500V. Or, further, bipolar operation could be achieved by making V4 +250 volts and V5 −250 volts. In all cases, however, V2 must be 4 volts lower in potential than V4, and V3 must be 4 volts higher in potential than V5.

Figure 3:
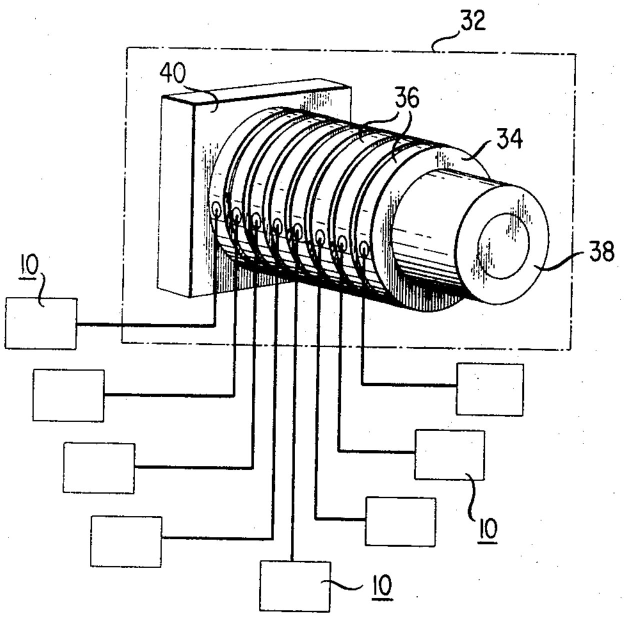
FIG. 3 illustrates a micropositioner utilizing amplifiers of the type illustrated in FIG. 1.

Referring now to FIG. 3A, there is illustrated within the dashed line rectangle a micropositioner 32. The micropositioner 32 comprises a first hollow cylinder 34 (typically composed of a lead zirconate-lead titanate mixture (PZT) having eight spaced silver rings 36 plated around the outside diameter thereof. A second cylindrical member 38, which is typically constructed of a hardened stable metal and has an outer diameter slightly greater than the inner diameter of cylinder 34, is forced fit inside cylinder 34 such that an interference fit exists between the two cylinders. A support member 40 is coupled to one end of the cylinder 34. The above combination acts as eight serial piezoelectric elements.

The sandwich of a ring 36 and the portion of the first cylinder underneath that ring and the second cylinder acts as a capacitance which is charged when a voltage is applied to the ring. If a high voltage, typically 500 volts, is applied to any one of the silver rings 36, the portion of cylinder 34 underneath the corresponding ring 36 expands circumferentially and longitudinally. Depending on the sequence in which voltages are applied to the rings, the second cylinder, which is friction-ally fit within the first cylinder, can be made to move forward or backward by preselected distances.

The application of voltage pulses sequentially to the rings 36 makes possible the accurate control of the movement of the second cylinder. The voltage pulses necessary to drive the individual segments (rings 36) of the micropositioner 32 are created by amplifier circuits 10 of FIG. 1. As is illustrated, the output of a separate amplifier 10 is coupled to each one of the ring 36.

A single micropositioner 32 can be used to control the position of a member in only one direction. Two micropositioners are necessary if two-directional control $(x,y)$ is desired. Likewise, if it is desired to position an element into a selected plane it is necessary to use three micropositioners.

Figure 4:
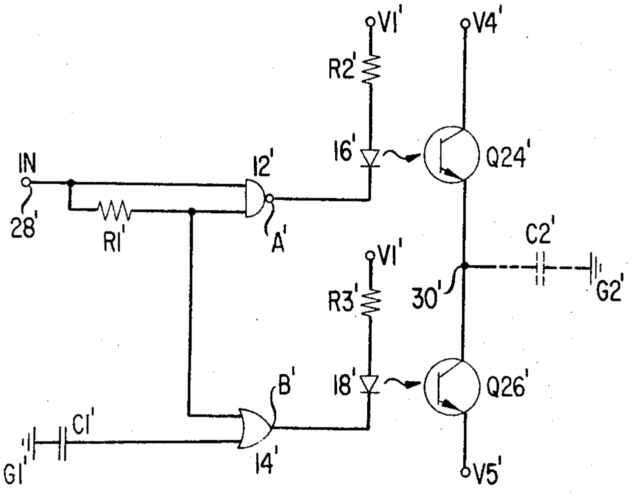
FIG. 4 illustrates in schematic form another amplifier circuit in accordance with the invention.

Now referring to FIG. 4, there is illustrated another amplifier circuit 10′ in accordance with this invention. Primed numericals corresponding to the numericals of FIG. 1 are utilized to illustrate the similarities to the amplifier 10 of FIG. 1. The amplifier 10′ comprises a two-input NAND gate 12′, a two-input OR gate 14′, a first LED 16′, a second LED 18′, a first npn-type output phototransistor Q24′, and a second npn-type output phototransistor Q26′. Terminal 28′, which is directly coupled to the first input of the NAND gate 12′ and the OR gate 14′, serves as the input terminal. Resistor R1′ is coupled between input terminal 28′ and the second input of logic gates 12′ and 14′. Capacitor C1′ is coupled between ground G1′ and the second input of each of the logic gates 12′ and 14′. Ground G1′ is electrically isolated from any ground or supply potential associated with phototransistors Q24′ and Q26′.

The cathodes of LED 16′ and 18′ are coupled to the outputs of 12′ and 14′, respectively. The anodes of LED 16′ and 18′ are coupled through resistors R2′ and R3′, respectively, to a supply potential V1′. The collector of Q24′ is coupled to supply potential V4′ and the emitter is coupled to the collector of Q26′. A load capacitance C2′ (illustrated in dashed lines) is coupled to terminal 30, which is coupled to the emitter of Q24′ and the collector of Q26′. Terminal 30 serves as the amplifier output terminal. The emitter of Q26′ is coupled to supply potential V5′.

LED 16′ and Q24′ are physically located such that light emitted by LED 16′ is received on the photosensitive base of Q24′ and biases Q24′ to allow conduction therein. Likewise, light emitted by LED 18′ is received on the photosensitive base of Q26′ and biases Q26′ to allow conduction therein.

The operation of amplifier 10′ of FIG. 4 is similar to that of amplifier 10 of FIG. 1 with a few exceptions. Output transistors Q24′ and Q26′ are both npn-type phototransistors and, therefore, are biased to conduct if light energy is received on the photosensitive bases. If the voltage waveform of FIG. 2A is applied to input terminal 28′ the output waveform appearing at terminal 30′ is substantially the same as is illustrated in FIG. 2D. The voltage waveform appearing at node A′, the output of NAND gate 12′, is substantially as illustrated in FIG. 2B. The voltage waveform appearing at node B′, the output of OR gate 14′, is the inverse of the waveform illustrated in FIG. 2C.

Because of the timing of the voltage waveforms created by logic gates 12' and 14' and R1' and C1', light is emitted by LEDs 16' and 18' such that there cannot be simultaneous conduction in Q24' and Q26'. This insures against excessive dissipation in these two transistors and helps maintain power dissipation at a relatively low value. The optical isolation between light-emitting diodes 16' and 18' and W24' and Q26' insures that a failure in either of these two transistors cannot propagate its way back to input terminal 28' and destroy any circuitry (not illustrated) coupled thereto.

The amplifier 10' of FIG. 4 is somewhat simpler than amplifier 10 of FIG. 1 in that it requires fewer components and yet has substantially the same positive characteristics.

The embodiments described herein are intended to be illustrative of the general embodiments of the invention. Various modifications are possible consistent with the spirit of the invention. For example, an LED-to-photodiode couple can be substituted for the LED-to-phototransistor couple provided an amplifier stage is added. This coupling, while affording the same electrical isolation as the LED-phototransistor pair, provides a faster response time. Still further, the supply potential for both LEDs need not be the same. Still further, the output voltage amplitude can be substantially increased by serially connecting identical output transistors for each output transistor.

What is claimed is:

1. An amplifier circuit comprising:

first and second output transistors;

first and second light-emitting sources;

the first and second light-emitting sources being coupled to the first and second output transistors respectively; and circuit means electrically connected to the first and second light-emitting sources for biasing both sources to cause simultaneous emission light from both sources at a preselected time and to cause prior to and subsequent to the simultaneous emission the second source to emit light and to inhibit light emission from the first source such that conduction occurs in only one of the two output transistors at a time.

2. The apparatus of claim 1 wherein the first and second output transistors are both npn-type junction photo transistors.

3. The apparatus of claim 2 wherein the first circuit means comprises a two-input NAND gate and a two-input OR gate;

the outputs of the NAND and OR gates being electrically connected to the first and second light-emitting sources, respectively;

the first input of the NAND and OR gate being electrically connected together;

an input terminal being electrically connected to the common first input of the NAND and OR gates; and a delay circuit electrically connected between the input terminal and each second input of the NAND and OR gates.

4. The apparatus of claim 1 wherein the first and second output transistors are complementary junction transistors.

5. The apparatus of claim 4 further comprising second and third circuit means being adapted to be responsive to light emitted from the first and second light-emitting sources, respectively; and the second circuit means being electrically connected to the first output transistor and the third circuit means being electrically connected to the second output transistor.

6. A high voltage pulse amplifier comprising:

first and second complementary junction transistors, the collectors of said transistors being electrically connected together;

first and second phototransistors, the collectors of the phototransistors being electrically connected to the bases of the first and second transistors, respectively;

the emitter of the second phototransistor being electrically connected to the emitter of the second transistor;

first and second light-emitting diodes;

the first diode being physically located with respect to the first phototransistor such that light emitted from the first diode is received on a photosensitive area of the first phototransistor;

the second diode being physically located with respect to the first phototransistor such that light emitted from the second diode is received on a photosensitive area of the second phototransistor; and circuit means electrically connected to the first and second diodes for biasing both diodes to cause simultaneous emission of light from both diodes at a preselected time and to cause prior to and subsequent to the simultaneous emission the second diode to emit light and to inhibit light emission from the first diode such that conduction occurs in only one of the two complementary junction transistors at a time.

7. The apparatus of claim 6 wherein the first circuit means comprises:

a two-input NAND gate;

a two-input NOR gate;

the output of the NAND gate being electrically connected to the first light-emitting diode;

the output of the NOR gate being electrically connected to the second light-emitting diode;

the first input of the NAND and NOR gates being electrically connected together;

an input terminal being electrically connected to the common first inputs of the logic gates; and a delay circuit electrically connected between the input terminal and the second inputs to the gates.

8. The apparatus of claim 7 wherein the first transistor is a pnp-type junction transistor and the second transistor is an npn-type junction transistor.

9. The apparatus of claim 8 wherein:

the delay circuit comprises a first resistor and a capacitor;

the resistor and capacitor being electrically connected to the second inputs of the gates; and the resistor also being electrically connected to the first inputs of the NAND and NOR gates.

10. The apparatus of claim 9 further comprising:

a second resistor electrically connected between the emitter and base of the first transistor; and a third resistor electrically connected to the emitter of the first phototransistor.

11. The apparatus of claim 10 further comprising:

a fourth resistor electrically connected to the collector of the second phototransistor;

a fifth resistor electrically connected to the anode of the first light-emitting diode; and a sixth resistor electrically connected to the anode of the second light-emitting diode.

12. In combination:

at least one high voltage amplifier comprising:

first and second complementary junction transistors, the collectors of said transistors being electrically connected together;

first and second phototransistors, the collectors of the phototransistors being electrically connected to the bases of the first and second transistors, respectively;

the emitter of the second phototransistor being electrically connected to the emitter of the second transistor;

first and second light-emitting diodes;

a two-input NAND gate;

a two-input NOR gate;

the output of the NAND gate being electrically connected to the first light-emitting diode;

the output of the NOR gate being electrically connected to the second light-emitting diode;

the first input of each of the NAND and NOR gates being electrically connected together;

an input terminal being electrically connected to the common first inputs to the gates;

a delay circuit electrically connected between the input terminal and the second inputs of the gates; and at least one piezoelectric element electrically connected to the amplifier.

* * * * *